United States Patent
Ruiz Sevillano et al.

(10) Patent No.: US 10,436,852 B2
(45) Date of Patent: Oct. 8, 2019

(54) BATTERY MONITORING USING A REDUNDANT NEIGHBOR MEASUREMENT

(71) Applicant: Infineon Technologies AG, Neubiberg (DE)

(72) Inventors: Jesus Ruiz Sevillano, Zorneding (DE); Guenter Hofer, St. Oswald (AT)

(73) Assignee: Infineon Technologies AG, Neubiberg (DE)

( * ) Notice: Subject to any disclaimer, the term of this patent is extended or adjusted under 35 U.S.C. 154(b) by 369 days.

(21) Appl. No.: 15/228,994

(22) Filed: Aug. 4, 2016

(65) Prior Publication Data
US 2018/0038915 A1 Feb. 8, 2018

(51) Int. Cl.
*G01R 31/02* (2006.01)
*G01R 31/396* (2019.01)
(Continued)

(52) U.S. Cl.
CPC ..... *G01R 31/396* (2019.01); *G01R 19/16542* (2013.01); *G01R 31/3646* (2019.01);
(Continued)

(58) Field of Classification Search
CPC ............ G01R 31/3648; G01R 31/3655; G01R 31/3675; G01R 31/02; G01R 31/04; G01R 31/36
(Continued)

(56) References Cited

U.S. PATENT DOCUMENTS

| | | | |
|---|---|---|---|
| 5,990,664 A * | 11/1999 | Rahman | H02J 7/0065 320/135 |
| 7,579,811 B2 * | 8/2009 | Sato | H01M 10/4264 320/134 |

(Continued)

FOREIGN PATENT DOCUMENTS

| | | |
|---|---|---|
| CN | 103308863 A | 9/2013 |
| CN | 104483630 A | 4/2015 |

(Continued)

OTHER PUBLICATIONS

"TLE8000 Lithium-Ion Battery Monitoring and Balancing IC," Infineon Technologies AG, Product Brief, Oct. 2012, 2 pp.
(Continued)

*Primary Examiner* — Jermele M Hollington
*Assistant Examiner* — Taqi R Nasir
(74) *Attorney, Agent, or Firm* — Shumaker & Sieffert, P.A.

(57) ABSTRACT

In one example, a circuit includes a first integrated circuit and a second integrated circuit. The first integrated circuit is configured to detect a first battery voltage that is associated with a first battery cell and output a representation of the first battery voltage. The first integrated circuit is further configured to detect a second battery voltage that is associated with a second battery cell that is connected in series with the first battery cell and output a status signal indicating whether the second battery voltage satisfies a first threshold. The second integrated circuit is configured to detect the first
(Continued)

battery voltage and output a status signal indicating whether the first battery voltage satisfies a second threshold. The second integrated circuit is further configured detect the second battery voltage and output a representation of the second battery voltage.

19 Claims, 6 Drawing Sheets

(51) Int. Cl.
G01R 31/36 (2019.01)
G01R 31/3835 (2019.01)
H02J 7/00 (2006.01)
G01R 19/165 (2006.01)
G01R 31/371 (2019.01)

(52) U.S. Cl.
CPC ....... *G01R 31/371* (2019.01); *G01R 31/3835* (2019.01); *H02J 7/0026* (2013.01)

(58) Field of Classification Search
USPC ....... 324/425, 426, 430, 432, 433, 509, 512, 324/528, 531, 541, 544
See application file for complete search history.

(56) References Cited

U.S. PATENT DOCUMENTS

| | | | |
|---|---|---|---|
| 7,723,960 B2* | 5/2010 | Funabashi | H02J 7/0031 320/114 |
| 7,915,863 B2* | 3/2011 | Wong | H02J 7/0031 320/134 |
| 9,728,993 B2 | 8/2017 | Butzmann | |
| 2012/0133370 A1* | 5/2012 | Kubo | B60L 11/1879 324/433 |

FOREIGN PATENT DOCUMENTS

| | | |
|---|---|---|
| CN | 204597507 U | 8/2015 |
| CN | 104953684 A | 9/2015 |
| WO | 2014090529 A1 | 6/2014 |

OTHER PUBLICATIONS

"Intersil Cell Balancing System," Intersil Automotive EV/HEV Products, retrieved from http://www.intersil.com/auto/EV_HEV.asp on Mar. 8, 2011, 5 pp.

"Hybrid Electric, Plug-in Hybrid Electric and Electric Vehicle (HEV/PHEV/EV) Battery Management Solutions," Intersil Automotive Solutions, 2012, 2 pp. (Applicant points out, in accordance with MPEP 609.04(a), that the year of publication, 2012, is sufficiently earlier than the effective U.S. filing date, Aug. 4, 2016, so that the particular month of publication is not in issue.).

Office Action, in the Chinese language, from counterpart Chinese Application No. 201710652351.4, dated Jul. 3, 2019, 7 pp.

* cited by examiner

BATTERY MONITORING USING A REDUNDANT NEIGHBOR MEASUREMENT

TECHNICAL FIELD

This disclosure relates to a battery monitoring system, such as a single cell lithium ion battery voltage monitoring system, that is configured to monitor a battery to ensure a safe operating state.

BACKGROUND

Battery monitoring systems may monitor voltages of a battery pack to ensure a safe operating state. For example, a single integrated circuit may monitor a voltage at each battery cell in a battery pack, and in response to an overvoltage at a battery cell, may output a warning signal. However, if the single integrated circuit fails to accurately monitor the voltage at the battery cell in the battery pack, the battery monitoring system may fail to output a warning signal when the battery pack is operating in an unsafe state.

SUMMARY

In general, this disclosure is directed to techniques for maximizing an availability of a battery pack while providing redundancy and diversity in the battery monitoring system. As used herein, availability may refer to a portion of time that a resulting device using the battery pack (e.g., energy storage device, forklift, automobile, or another resulting device), is operational for its intended use compared to a portion of time that the resulting device is not operational for its intended use until repaired. Additionally, as used herein, redundancy may refer to performing the same measurement more than once, for instance, but not limited to, by taking multiple measurements using different technologies, different techniques, or performing the same measurement more than once in another manner. In some examples, redundancy may prevent an error in the measurement that causes the battery monitoring system to fail to identify an unsafe operating condition of the resulting device using the battery pack. As used herein, diversity may refer to performing the same measurement more than once using different devices, for instance, different integrated circuits (ICs).

In some examples, rather than relying on a single integrated circuit to perform measurements of a battery pack, a battery monitoring system may use multiple integrated circuits. Additionally, or alternatively, rather than each integrated circuit performing a measurement of each battery cell of a battery pack, a complexity in connecting the battery pack to the battery monitoring system may be reduced by connecting an integrated circuit to neighboring battery cells and refraining from connecting the integrated circuit to remote battery cells. For instance, an integrated circuit of the battery monitoring system may measure a voltage of a second battery cell as well as a voltage of a first battery cell, which is adjacent to the second battery cell, and a voltage of a third battery cell, which is adjacent to the second battery cell. In this manner, a complexity in connecting the battery pack to the battery monitoring system may be reduced while improving a redundancy and diversity of the battery monitoring system.

In an example, a circuit includes a first integrated circuit and a second integrated circuit. The first integrated circuit is configured to detect a first battery voltage that is associated with a first battery cell and output, based on the detected first battery voltage, a representation of the first battery voltage. The first integrated circuit is further configured to detect a second battery voltage that is associated with a second battery cell that is connected in series with the first battery cell and output, based on a comparison of the detected second battery voltage and a first threshold, a status signal indicating whether the second battery voltage satisfies the first threshold. The second integrated circuit is configured to detect the first battery voltage and output, based on a comparison of the detected first battery voltage and a second threshold, a status signal indicating whether the first battery voltage satisfies the second threshold. The second integrated circuit is further configured to detect the second battery voltage and output, based on the detected second battery voltage, a representation of the second battery voltage.

In another example, a method includes detecting, by a first integrated circuit, a first battery voltage associated with a first battery cell, outputting, by the first integrated circuit, based on the detected first battery voltage, a representation of the first battery voltage, detecting, by the first integrated circuit, a second battery voltage associated with a second battery cell that is connected in series with the first battery cell, and outputting, by the first integrated circuit, based on a comparison of the detected second battery voltage and a first threshold, a status signal indicating whether the second battery voltage satisfies the first threshold. The method further includes detecting, by a second integrated circuit, the first battery voltage, outputting, by the second integrated circuit, based on a comparison of the detected first battery voltage and a second threshold, a status signal indicating whether the first battery voltage satisfies the second threshold, detecting, by the second integrated circuit, the second battery voltage, and outputting, by the second integrated circuit, based on the detected second battery voltage, a representation of the second battery voltage.

In another example, a system includes a set of battery cells, a first integrated circuit, and a second integrated circuit. The set of battery cells is electronically coupled to each other in series to form a battery pack. The set of battery cells includes a first battery cell and a second battery cell. The first integrated circuit is configured to detect a first battery voltage of the first battery cell and output, based on the detected first battery voltage, a representation of the first battery voltage. The first integrated circuit is further configured to detect a second battery voltage of the second battery cell. The second integrated circuit is configured to detect the second battery voltage of the second battery cell and output, based on the detected second battery voltage, a representation of the second battery voltage. The second integrated circuit is further configured to detect the first battery voltage of the first battery cell.

Details of these and other examples are set forth in the accompanying drawings and the description below. Other features, objects, and advantages will be apparent from the description and drawings, and from the claims.

DETAILED DESCRIPTION

Some battery systems may use a single integrated circuit to measure comfort levels (e.g., high automotive safety integrity level (ASIL) levels) of each battery cell in a battery pack and a second integrated circuit to measure safety levels (e.g., low ASIL levels) of each battery cell in the battery pack. However, such systems may have a high complexity in connecting the battery pack to the battery monitoring system.

Some battery systems may use a single integrated circuit to measure comfort levels of each battery cell of the battery pack using a first analog to digital converter technology and measure safety levels of each battery cell of the battery pack using a second analog to digital converter technology. However, such systems may necessarily lack diversity since only one integrated circuit performs all of the measurements for a battery cell which may result in a reduced availability.

In some examples, rather than using a single integrated circuit to measure each battery cell of a battery pack, a battery monitoring system may use a set of integrated circuits that are each configured to measure a respective battery cell as well as a neighbor battery cell. Said differently, each battery cell may have a corresponding integrated circuit for measuring the corresponding battery cell and for measuring a neighboring battery cell. In this manner, a resulting device may have an improved redundancy and improved availability while minimizing a complexity in connecting the battery pack to the battery monitoring system.

Figure 1:
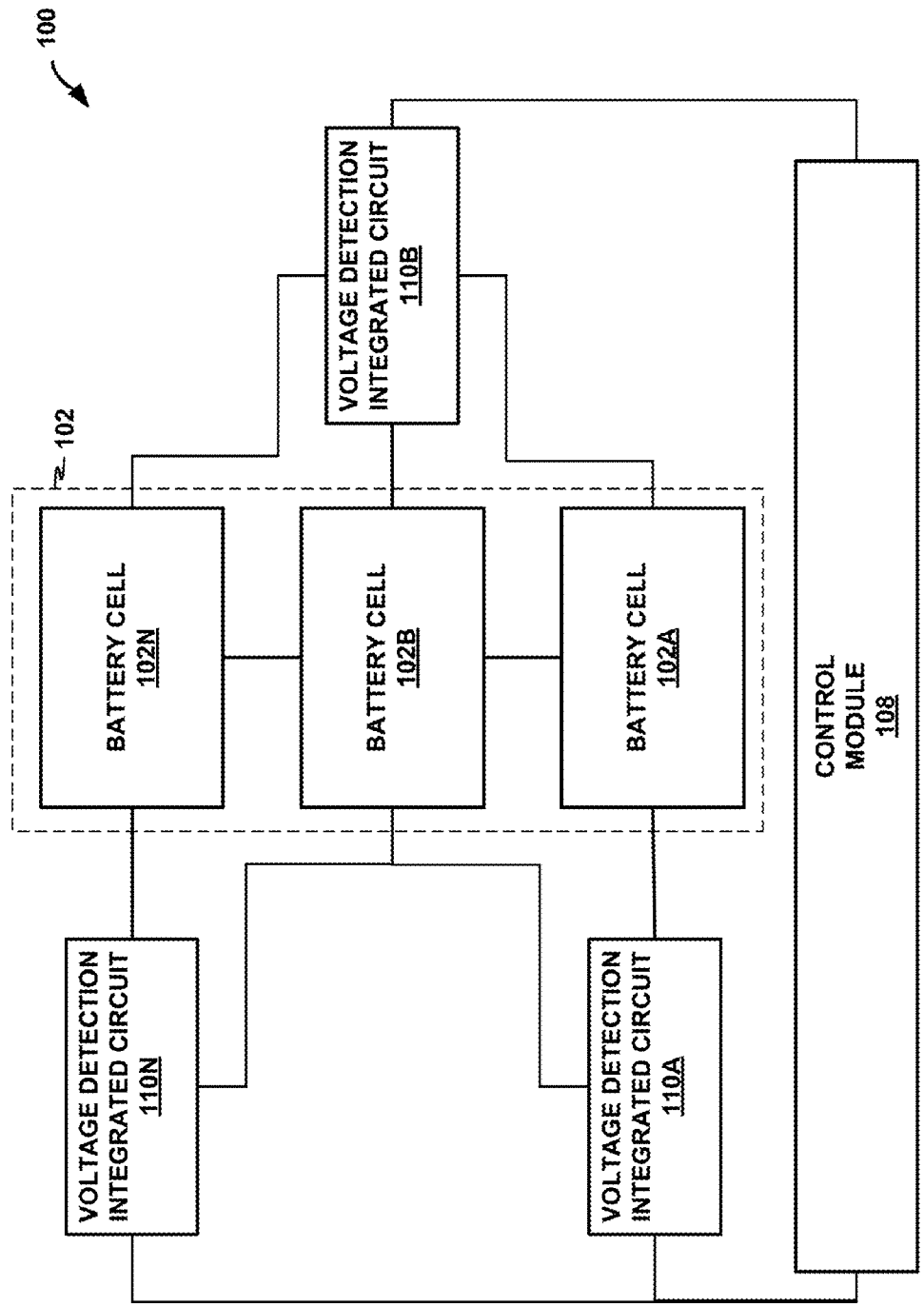
FIG. 1 is a block diagram illustrating an example battery monitoring system configured to use a redundant neighbor measurement, in accordance with one or more techniques of this disclosure.

FIG. 1 is a block diagram illustrating an example battery monitoring system 100 configured to use a redundant neighbor measurement, in accordance with one or more techniques of this disclosure. As illustrated in the example of FIG. 1, system 100 may include battery cells 102A, 102B, . . . , 102N (collectively, "battery pack 102"), control module 108, and voltage detection integrated circuits 110A, 110B, . . . , 110N (collectively, "integrated circuits 110"). It should be understood that system 100 may include any suitable number (e.g., 'N' number) of battery cells 102 and integrated circuits 110, for instance, 4, 5, 6, 7, . . . , 100, etc.

Battery pack 102 may include any suitable energy storage device that permits system 100 to operate. In some examples, battery pack 102 may receive energy from an energy source (e.g., an alternator coupled to a combustion engine, electrical grid connection, or another energy source). Battery pack 102 may include mechanical energy storage devices (e.g., flywheel), electrical energy storage devices (e.g., capacitor, super capacitors), electrochemical energy storage devices (e.g., batteries), or other types of energy storage devices. Examples of batteries may include lead-acid, nickel metal hydride, lithium-ion, or other types of batteries.

Control module 108 may be configured determine whether battery pack 102 is operating in safe state. In some examples, control module 108 may determine whether battery pack 102 is operating in safe state based on status information received from integrated circuits 110. A safe state may refer to when a voltage of each battery cell of battery pack 102 is within a voltage range, for instance, above a minimum voltage during use and below a maximum voltage during charging. Additionally, or alternatively, a safe state may refer to when a temperature of each battery cell of battery pack 102 is within a temperature range, for instance, below a maximum temperature. In some examples, control module 108 may include an analog circuit. In some examples, control module 108 may be a microcontroller on a single integrated circuit containing a processor core, memory, inputs, and outputs. For example, control module 108 may include one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. In some examples, control module 108 may be a combination of one or more analog components and one or more digital components.

Integrated circuits 110 may be configured to measure levels of each battery cell (e.g., 102A, 102B, etc.) of battery pack 102. In some examples, an integrated circuit of integrated circuits 110 may measure a voltage of a battery cell of battery pack 102. Additionally, or alternatively, an integrated circuit of integrated circuits 110 may measure a temperature of a battery cell of battery pack 102. As used herein, an integrated circuit may refer to a monolithic integrated circuit. Examples of integrated circuits may include, but are not limited to, a chip, a microchip, system on chip (SOC), or another integrated circuit. In some examples, integrated circuits 110 may include an analog circuit. In some examples, integrated circuits 110 may be a microcontroller on a single integrated circuit containing a processor core, memory, inputs, and outputs. For example, integrated circuits 110 may include one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. In some examples, integrated circuits 110 may be a combination of one or more analog components and one or more digital components.

Rather than using a single integrated circuit to measure each battery cell of battery pack 102, integrated circuits 110 may each be configured to measure a respective battery cell as well as a neighbor battery cell. In some examples, a single integrated circuit may be configured to output a representation of the battery voltage at a neighbor battery cell. For instance, integrated circuit 110B may output, to control module 108, based on a detected voltage at battery cell 102A, a representation of the battery voltage at battery cell 102A. Additionally, or alternatively, a single integrated circuit may be configured to output a representation of a difference in voltage at the respective battery cell and at a neighbor battery cell. For instance, integrated circuit 110B may output, to control module 108, based on a detected voltage at battery cell 102A and a detected voltage at battery cell 102B, a representation of a difference between the detected voltage at battery cell 102A and the detected voltage at battery cells 102B. Additionally, or alternatively, a single integrated circuit may be configured to output a status signal for a neighbor battery cell. For instance, integrated circuit 110B may output, to control module 108, based on a detected voltage at battery cell 102A and a threshold value, a status signal indicating whether a battery voltage at battery cell 102A satisfies the threshold. In this manner, system 100 may have an improved redundancy, diversity, and availability while minimizing a complexity in connecting battery pack 102 to integrated circuits 110.

For example, integrated circuit 110A may be configured to detect a first battery voltage that is associated with battery cell 102A and output, to control module 108, based on the detected first battery voltage, a representation of the first battery voltage integrated circuit 110A may be further configured to detect a second battery voltage that is associated with battery cell 102B that is connected in series with battery cell 102A and output, to control module 108, based on a comparison of the detected second battery voltage and a first threshold, a status signal indicating whether a battery voltage at battery cell 102B satisfies the first threshold.

Integrated circuit 110B may be configured to detect the first battery voltage and output, to control module 108, based on a comparison of the detected first battery voltage and a second threshold, a status signal indicating whether the first battery voltage satisfies the second threshold. Integrated circuit 110B may be further configured to detect the second battery voltage and output, to control module 108, based on the detected second battery voltage, a representation of the second battery voltage. As shown in FIG. 1, integrated circuit 110B may be further configured to detect a third battery voltage that is associated with battery cell 102N that is connected in series with battery cells 102A and 102B and output, to control module 108, based on a comparison of the detected third battery voltage and a third threshold, a status signal indicating whether the third battery voltage satisfies the third threshold.

Integrated circuit 110N may be configured to detect the second battery voltage and output, to control module 108, based on a comparison of the detected second battery voltage and a fourth threshold, a status signal indicating whether the second battery voltage satisfies the fourth threshold. Integrated circuit 110N may be further configured to detect the third battery voltage and output, to control module 108, based on the detected third battery voltage, a representation of the third battery voltage.

Control module 108 may determine whether battery pack 102 is operating in a safe state based on status information. For example, control module 108 may receive, from integrated circuit 110A, a first set of status information, receive, from integrated circuit 110B, a second set of status information, receive, from integrated circuit 110N, a third set of status information, and determine, based on the first, second, and third sets of status information, whether battery pack 102 is operating in a safe state. The first set of status information may include the representation of the first battery voltage and the status signal indicating whether the second battery voltage satisfies the first threshold. The second set of status information may include the representation of the second battery voltage, the status signal indicating whether the first battery voltage satisfies the second threshold, and the status signal indicating whether the third battery voltage satisfies the third threshold. The third set of status information may include the representation of the third battery voltage and the status signal indicating whether the second battery voltage satisfies the fourth threshold. In this manner, one or more techniques described above may permit system 100 to have an improved redundancy, diversity, and availability while minimizing a complexity in connecting battery pack 102 to integrated circuits 110. For example, a safety of battery cell 102B may be maintained during a failure of one or two of integrated circuits 110A-N.

Figure 2:
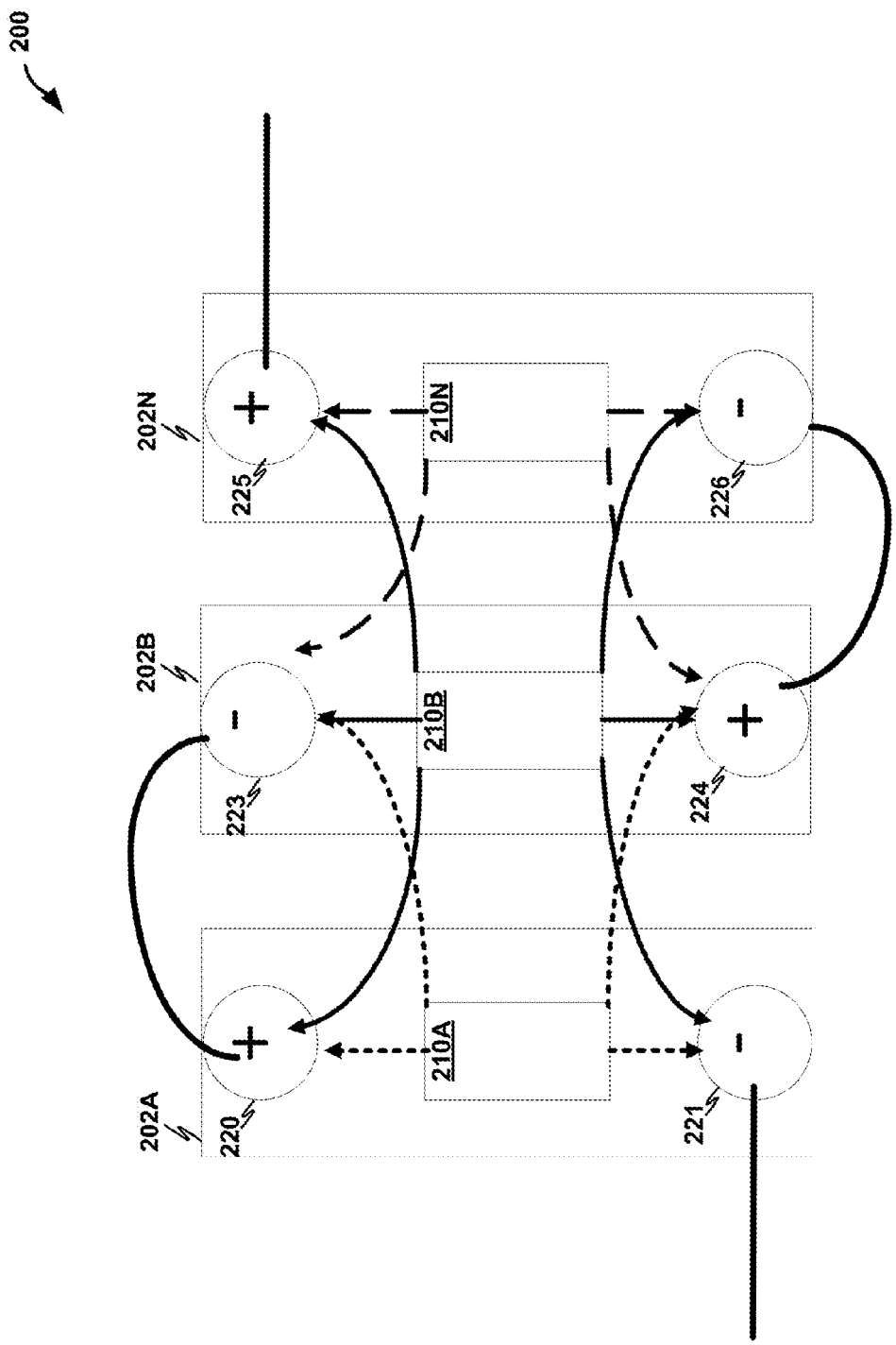
FIG. 2 is a first connection diagram illustrating exemplary connections of the system of FIG. 1, in accordance with one or more techniques of this disclosure.

FIG. 2 is a first connection diagram illustrating exemplary connections of the system of FIG. 1, in accordance with one or more techniques of this disclosure. As illustrated in the example of FIG. 2, system 200 may include battery cells 202A, 202B, . . . , 202N (collectively, "battery pack 202") and voltage detection integrated circuits 210A, 210B, . . . , 210N (collectively, "integrated circuits 210"). Battery pack 202 may be an example of battery pack 102 of FIG. 1. Integrated circuits 210 may be an example of integrated circuits 110 of FIG. 1. It should be understood that system 200 may include any suitable number (e.g., 'N' number) of battery cells 202 and integrated circuits 210, for instance, 4, 5, 6, 7, . . . , 100, etc.

Battery pack 202 may be configured in series. In some examples, battery cell 202A may be coupled in series with battery cell 202B. For instance, as shown, positive terminal 220 of battery cell 202A may be coupled to negative terminal 223 of battery cell 202B. In some examples, battery cells 202A-N may be coupled in series. For instance, as shown, positive terminal 220 of battery cell 202A may be coupled to negative terminal 223 of battery cell 202B and positive terminal 224 of battery cell 202B may be coupled to negative terminal 226 of battery cell 202N. As shown, the one end (e.g., negative) of a series string formed by battery pack 202 may be negative terminal 221 of battery cell 202A and the other end (e.g., positive) of the series string formed by battery pack 202 may be positive terminal 225 of battery cell 202N.

Rather than coupling each battery cell of battery pack 202 to each one of integrated circuits 210, system 200 may couple each one of integrated circuits 210 to a battery cell of battery pack 202 and a neighboring battery cell. For example, integrated circuit 210A may detect a first battery voltage, for example, across positive terminal 220 and negative terminal 221, that is associated with battery cell 202A, a second battery voltage, for example, across negative terminal 223 and positive terminal 224, that is associated with battery cell 202B, and refrain from detecting a third battery voltage, for example, across positive terminal 225 and negative terminal 226, that is associated with battery cell 202N. Said differently, integrated circuit 210A may detect a voltage for battery cell 202B since battery cell 202A neighbors battery cell 202B and integrated circuit 210A may refrain from detecting a voltage for battery cell 202N since battery cell 202N is remote from battery cell 202A.

Additionally, or alternatively, integrated circuit 210N may refrain from detecting the first battery voltage that is associated with battery cell 202A and detect the second battery voltage that is associated with battery cell 202B and the third battery voltage that is associated with battery cell 202N. Said differently, integrated circuit 210N may detect a voltage for battery cell 202B since battery cell 202N neighbors battery cell 202B and integrated circuit 210N may refrain from detecting a voltage for battery cell 202A since battery cell 202A is remote from battery cell 202N.

Additionally, or alternatively, integrated circuit 210B may detect the first battery voltage that is associated with battery cell 202A, the second battery voltage that is associated with battery cell 202B, and the third battery voltage that is associated with battery cell 202N since battery cells 202A and 202N neighbor battery cell 202B. Said differently, integrated circuit 210B may detect voltages for battery cells 202A and 202N since battery cell 202B neighbors both battery cell 202A and 202N. In this manner, a complexity in connecting battery pack 202 to integrated circuits 210 may be reduced by connecting integrated circuits 210 to neighboring battery cells of battery pack 202 and refraining from connecting integrated circuits 210 to remote battery cells of battery pack 202.

Figure 3:
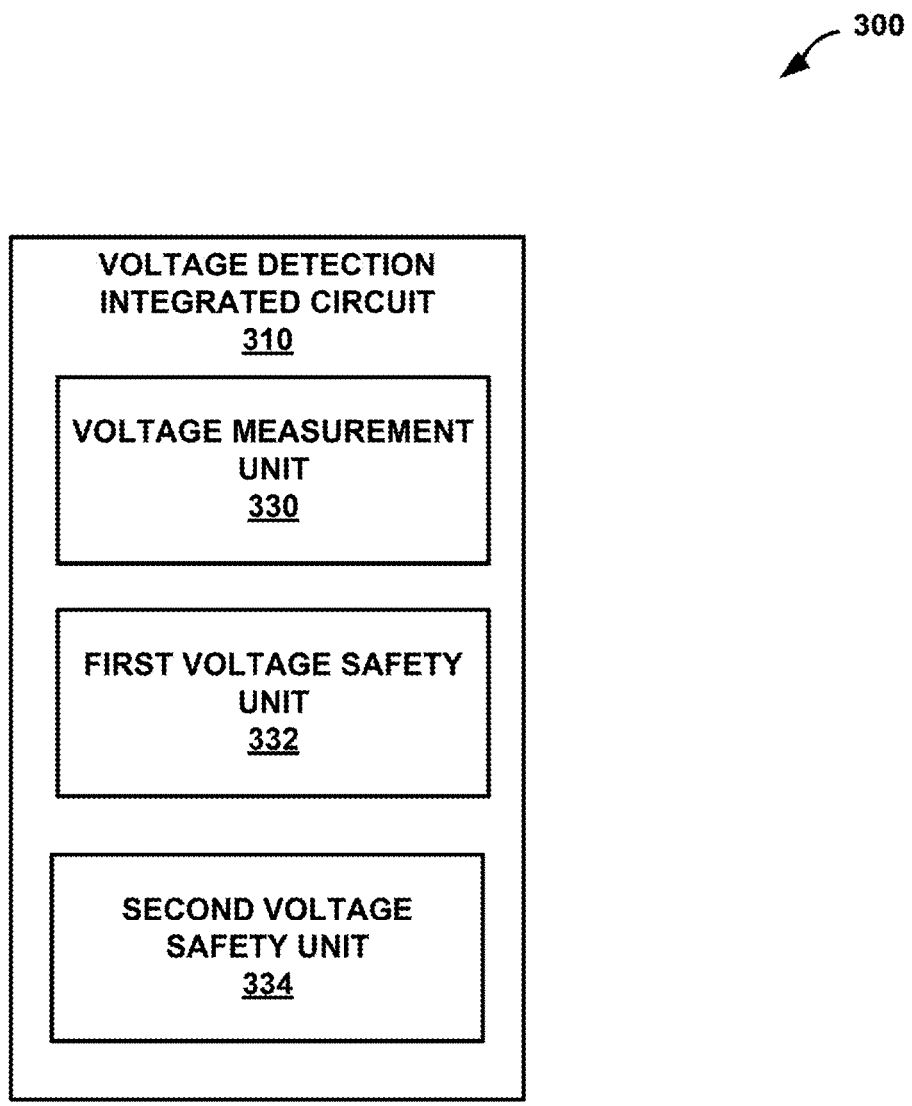
FIG. 3 is a block diagram illustrating an example voltage detection integrated circuit of the system of FIG. 1, in accordance with one or more techniques of this disclosure.

FIG. 3 is a block diagram illustrating an example voltage detection integrated circuit 310 of the system of FIG. 1, in accordance with one or more techniques of this disclosure. Integrated circuit 310 may be an example of integrated circuits 110 of FIG. 1 and/or integrated circuits 210 of FIG. 2. As shown, integrated circuit 310 may include voltage measurement unit 330, first voltage safety unit 332 and second voltage safety unit 334.

Voltage measurement unit 330 may be configured to provide an indication of a voltage level at a battery cell. In some examples, voltage measurement unit 330 may measure a comfort level (e.g., high ASIL levels) of a battery cell in a battery pack. In some examples, voltage measurement unit 330 may be configured to detect a battery voltage that is associated with a battery cell. For instance, voltage measurement unit 330 may detect a voltage across negative terminal 223 and positive terminal 224 of battery cell 202B of FIG. 2. In some examples, voltage measurement unit 330 may detect a voltage of battery cell 102B of FIG. 1. Voltage measurement unit 330 may be configured to output, based on the detected battery voltage, a representation of the battery voltage. For instance, voltage measurement unit 330 may output to control module 108 of FIG. 1, a voltage proportional to the detected battery voltage.

First voltage safety unit 332 may be configured to ensure a neighboring battery cell is operating in a safe state. In some examples, first voltage safety unit 332 may measure a safety level (e.g., low ASIL levels) of a neighboring battery cell in the battery pack. In some examples, first voltage safety unit 332 may be configured to detect a battery voltage that is associated with a battery cell. For instance, first voltage safety unit 332 may detect a voltage across positive terminal 220 and negative terminal 221 of battery cell 202A of FIG. 2. In some examples, first voltage safety unit 332 may detect a voltage of battery cell 102A of FIG. 1. First voltage safety unit 332 may be configured to output, based on a comparison of the detected battery voltage and a first threshold, a status signal indicating whether the battery voltage satisfies the first threshold. The first threshold value may be a user selected value, a predetermined threshold that is selected during a fabrication of integrated circuit 310, or selected by another process. For instance, in response to determining that the voltage across positive terminal 220 and negative terminal 221 of battery cell 202A is within a predetermined safety voltage operating range, first voltage safety unit 332 may output a status signal indicating that battery cell 202A satisfies the predetermined safety voltage operating range (e.g., a high logical level, a low logical level, or the like). Additionally, or alternatively, in response to determining that the voltage across positive terminal 220 and negative terminal 221 of battery cell 202A is outside the predetermined safety voltage operating range, first voltage safety unit 332 may output a status signal indicating that battery cell 202A does not satisfy the predetermined safety voltage operating range (e.g., a low logical level, a high logical level, or the like).

Second voltage safety unit 334 may be configured to ensure a neighboring battery cell is operating in a safe state. In some examples, second voltage safety unit 334 may measure a safety level (e.g., low ASIL levels) of a neighboring battery cell in the battery pack. In some examples, second voltage safety unit 334 may be configured to detect a battery voltage that is associated with a battery cell. For instance, second voltage safety unit 334 may detect a voltage across positive terminal 225 and negative terminal 226 of battery cell 202N of FIG. 2. In some examples, second voltage safety unit 334 may detect a voltage of battery cell 102N of FIG. 1. Second voltage safety unit 334 may be configured to output, based on a comparison of the detected battery voltage and a second threshold, a status signal indicating whether the battery voltage satisfies the second threshold. The second threshold value may be a user selected value, a predetermined threshold that is selected during a fabrication of integrated circuit 310, or selected by another process.

In some examples, the first threshold value for first voltage safety unit 332 and the second threshold values for second voltage safety unit 334 are different. In some examples, the first threshold value for first voltage safety unit 332 and the second threshold values for second voltage safety unit 334 are identical. For instance, in response to determining that the voltage across positive terminal 225 and negative terminal 226 of battery cell 202N is within the predetermined safety voltage operating range, second voltage safety unit 334 may output a status signal indicating that battery cell 202N satisfies the predetermined safety voltage operating range (e.g., a high logical level, a low logical level, or the like). Additionally, or alternatively, in response to determining that the voltage across positive terminal 225 and negative terminal 226 of battery cell 202N is outside the predetermined safety voltage operating range, second voltage safety unit 334 may output a status signal indicating that battery cell 202N does not satisfy the predetermined safety voltage operating range (e.g., a low logical level, a high logical level, or the like).

Voltage measurement unit 330 may measure levels of a battery cell using a different measurement error than first voltage safety unit 332 and/or second voltage safety unit 334. For example, voltage measurement unit 330 may have a higher measurement accuracy than first voltage safety unit 332 and/or second voltage safety unit 334. For instance, voltage measurement unit 330 may have an accuracy of +/−2 millivolts (mV) and first voltage safety unit 332 and/or second voltage safety unit 334 may have an accuracy of +/−50 millivolts (mV). In some examples, voltage measurement unit 330 may measure levels of a battery cell using a same measurement error as first voltage safety unit 332 and/or second voltage safety unit 334.

Voltage measurement unit 330 may measure levels of a battery cell using a different technology than first voltage safety unit 332 and/or second voltage safety unit 334. For example, voltage measurement unit 330 may measure levels of a battery cell using a different analog to digital converter technology than first voltage safety unit 332 and/or second voltage safety unit 334.

Figure 4:
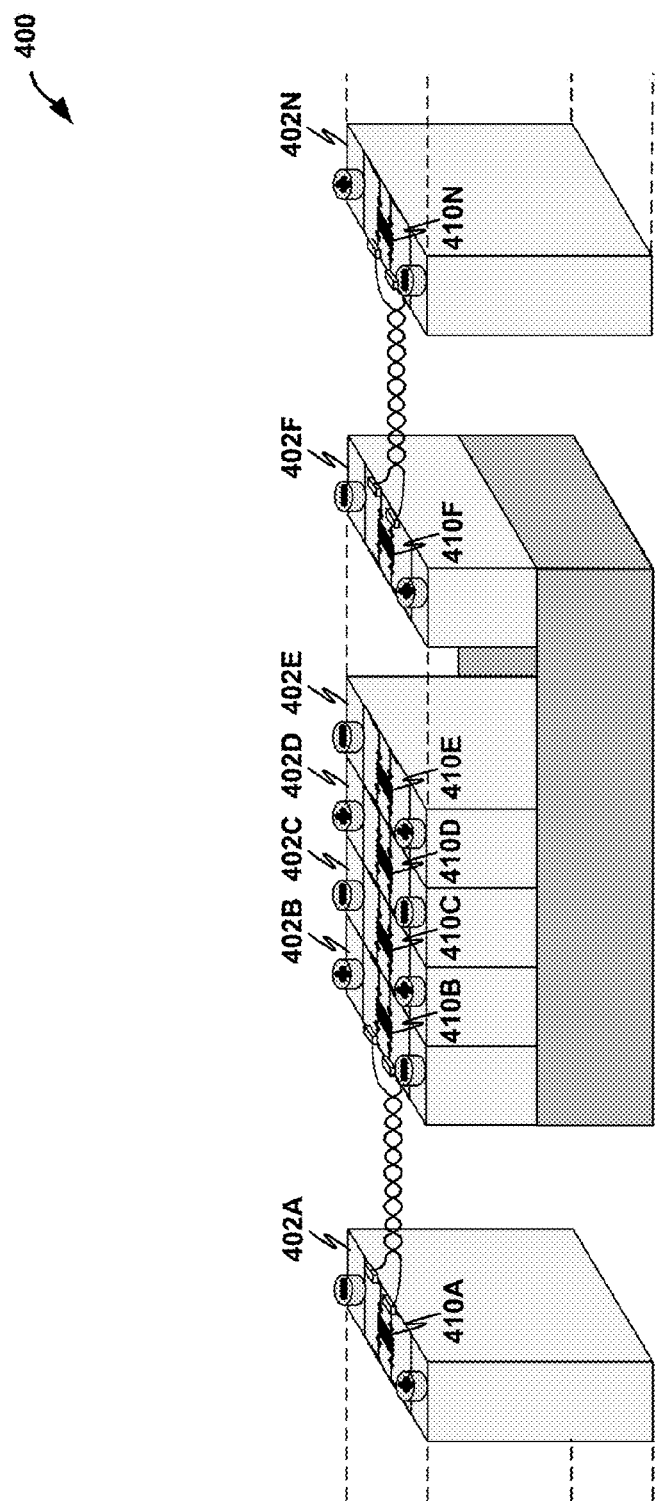
FIG. 4 is a second connection diagram illustrating exemplary connections of the system of FIG. 1, in accordance with one or more techniques of this disclosure.

FIG. 4 is a second connection diagram illustrating exemplary connections of the system of FIG. 1, in accordance with one or more techniques of this disclosure. As illustrated in the example of FIG. 4, system 400 may include battery cells 402A, 402B, 402C, 402D, 402E, 402F, . . . , and 402N (collectively, "battery pack 402") and voltage detection integrated circuits 410A, 410B, 410C, 410D, 410E, 410F, . . . , and 410N (collectively, "integrated circuits 410"). Battery pack 402 may be an example of battery pack 102 of FIG. 1 and/or battery pack 202 of FIG. 2. Integrated circuits 410 may be an example of integrated circuits 110 of FIG. 1, integrated circuits 210 of FIG. 2, and/or integrated circuit 310 of FIG. 3. It should be understood that system 400 may include any suitable number (e.g., 'N' number) of battery cells 402 and integrated circuits 410, for instance, 4, 5, 6, 7, ..., 100, etc.

In the example of FIG. 4, each one of integrated circuits 410 detects a battery voltage of one of the battery cells of battery pack 402 for outputting a representation of the respective battery cells. For example, integrated circuit 410A may detect a battery voltage of battery cell 402A, integrated circuit 410B may detect a battery voltage of battery cell 402B, integrated circuit 410C may detect a battery voltage of battery cell 402C, and so on.

Rather than relying on one integrated circuit to ensure safety of a battery cell of battery pack 402, integrated circuits 410 may be configured to detect a voltage of a neighboring battery cell of battery pack 402. For example, integrated circuit 410A may detect a battery voltage of battery cell 402B, integrated circuit 410B may detect a battery voltage of battery cell 402C, integrated circuit 410C may detect a battery voltage of battery cell 402D, and so on. Additionally, or alternatively, integrated circuit 410B may detect a battery voltage of battery cell 402A, integrated circuit 410C may detect a battery voltage of battery cell 402B, integrated circuit 410D may detect a battery voltage of battery cell 402C, and so on. In this manner, a diversity of devices may help to ensure that system 400 detects when battery pack 402 operates in an unsafe state.

Figure 5:
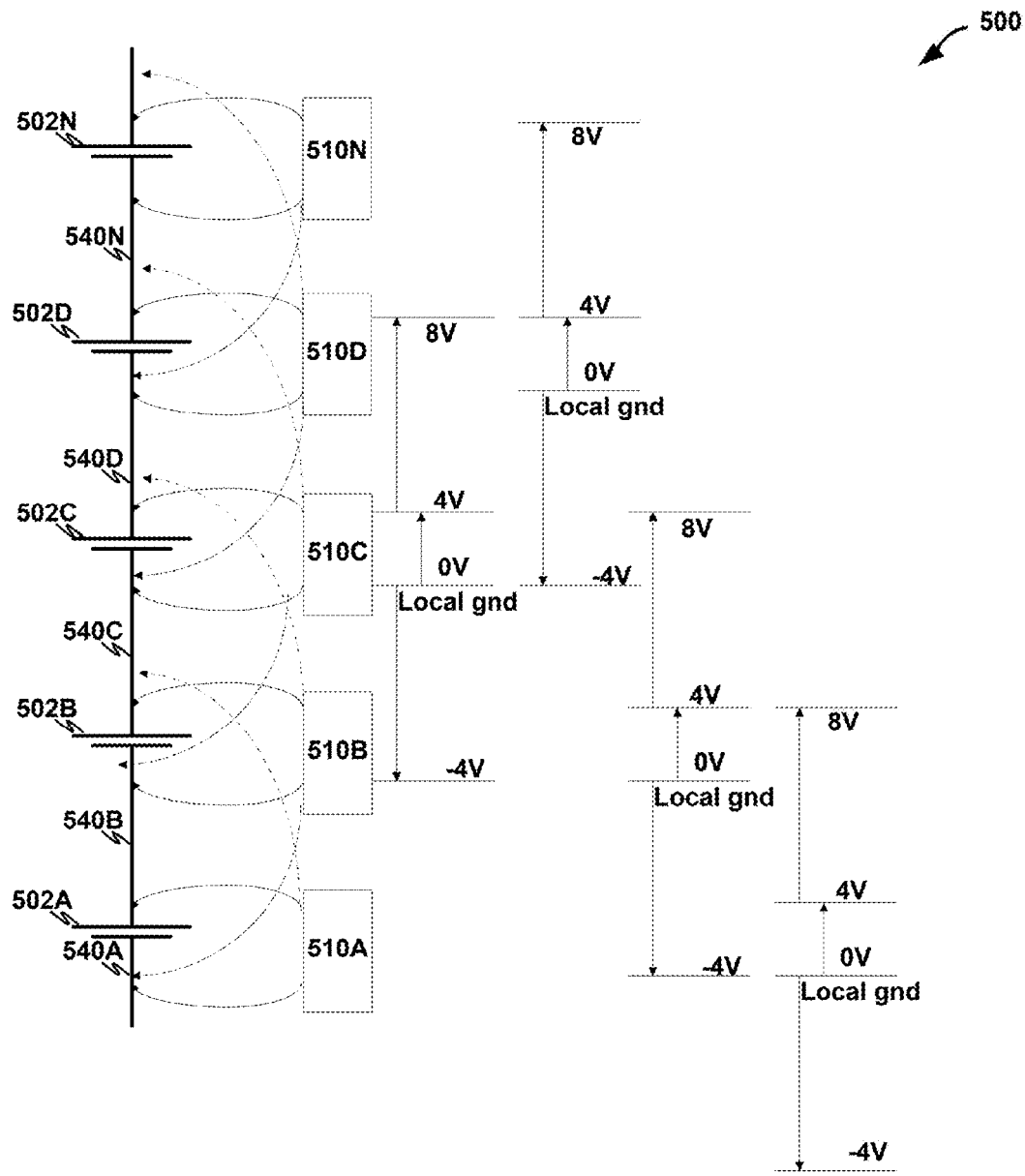
FIG. 5 is an illustration of voltage domains of the system of FIG. 1, in accordance with one or more techniques of this disclosure.

FIG. 5 is an illustration of voltage domains of the system of FIG. 1, in accordance with one or more techniques of this disclosure. As illustrated in the example of FIG. 5, system 500 may include battery cells 502A, 502B, 502C, 502D, ..., and 502N (collectively, "battery pack 502") and voltage detection integrated circuits 510A, 510B, 510C, 510D, ..., and 510N (collectively, "integrated circuits 510"). Battery pack 502 may be an example of battery pack 102 of FIG. 1, battery pack 202 of FIG. 2, and/or battery pack 402 of FIG. 4. Integrated circuits 510 may be an example of integrated circuits 110 of FIG. 1, integrated circuits 210 of FIG. 2, and/or integrated circuit 310 of FIG. 3. It should be understood that system 500 may include any suitable number (e.g., 'N' number) of battery cells 502 and integrated circuits 510, for instance, 4, 5, 6, 7, ..., 100, etc.

In some examples, battery cells of battery pack 502 may be connected in series. For example, as shown, first battery cell 502A may have a negative terminal coupled to a local ground of integrated circuit 510A and a positive terminal coupled to the local ground of integrated circuit 510B, battery cell 502B has a negative terminal coupled to the positive terminal of battery cell 502A and a positive terminal, battery cell 502C has negative terminal coupled to positive terminal of battery cell 502B and a positive terminal, and so on.

In some examples, battery cells of battery pack 502 may have substantially equal battery voltages. For example, each battery cell of battery pack 502 may have battery voltages that operate within 10% of a maximum battery voltage of battery pack 502. For instance, each battery cell of battery pack 502 may be configured to operate in a range of 3.7 volts to 4.3 volts.

In the example of FIG. 5, each one of integrated circuits 510 may have a local ground. For instance, integrated circuit 510A may have a local ground a voltage 540A, integrated circuit 510B may have a local ground a voltage 540B, integrated circuit 510C may have a local ground a voltage 540C, integrated circuit 510D may have a local ground a voltage 540D, and integrated circuit 510N may have a local ground a voltage 540N. Said differently, a battery voltage for battery cell 502A may extend from voltage 540A, which is less than a local ground of the integrated circuit 510B (e.g., voltage 540B) to the local ground (e.g., voltage 540B) of integrated circuit 510B, a battery voltage for battery cell 502B may extend from the local ground (e.g., voltage 540B) of integrated circuit 510B to voltage 540C that is greater than the local ground of (e.g., voltage 540B) of integrated circuit 510B, a battery voltage for battery cell 502C may extend from voltage 540C to voltage 540D, which is greater than voltage 540B, and so on. In this manner, each integrated circuit of integrated circuits 510 may be configured to operate in three voltage domains, which may permit simpler fabrication designs. For example, integrated circuits 510 may be manufactured using standard complementary metal-oxide-semiconductor (CMOS) technology. More specifically, for example, integrated circuits 510 may be manufactured using a resistive voltage divider having a measurement range of about 200 mV.

In some examples, integrated circuits 510 may measure voltages using different measurement accuracies. For example, each one of integrated circuits 510 may measure comfort levels (e.g., high ASIL levels) of one battery cell in battery pack 502 and may measure safety levels (e.g., low ASIL levels) of at least one other battery cell in battery pack 502. Using different measurement accuracies may permit a high accuracy for comfort levels which may improve a performance of a resulting device and may permit a low accuracy for safety levels to simplify implementation, thereby reducing a cost of the resulting device.

For instance, integrated circuits 510 may measure voltages according to Table 1.

TABLE 1

| Battery Cell | Integrated Circuit | Measurement Accuracy |
| --- | --- | --- |
| 502A | 510A | +/−2 mV |
|  | 510B | +/−50 mV |
| 502B | 510A | +/−50 mV |
|  | 510B | +/−2 mV |
|  | 510C | +/−50 mV |
| 502C | 510B | +/−50 mV |
|  | 510C | +/−2 mV |
|  | 510D | +/−50 mV |
| 502D | 510C | +/−50 mV |
|  | 510D | +/−2 mV |
|  | 510N | +/−50 mV |
| 502N | 510D | +/−50 mV |
|  | 510N | +/−2 mV |

Figure 6:
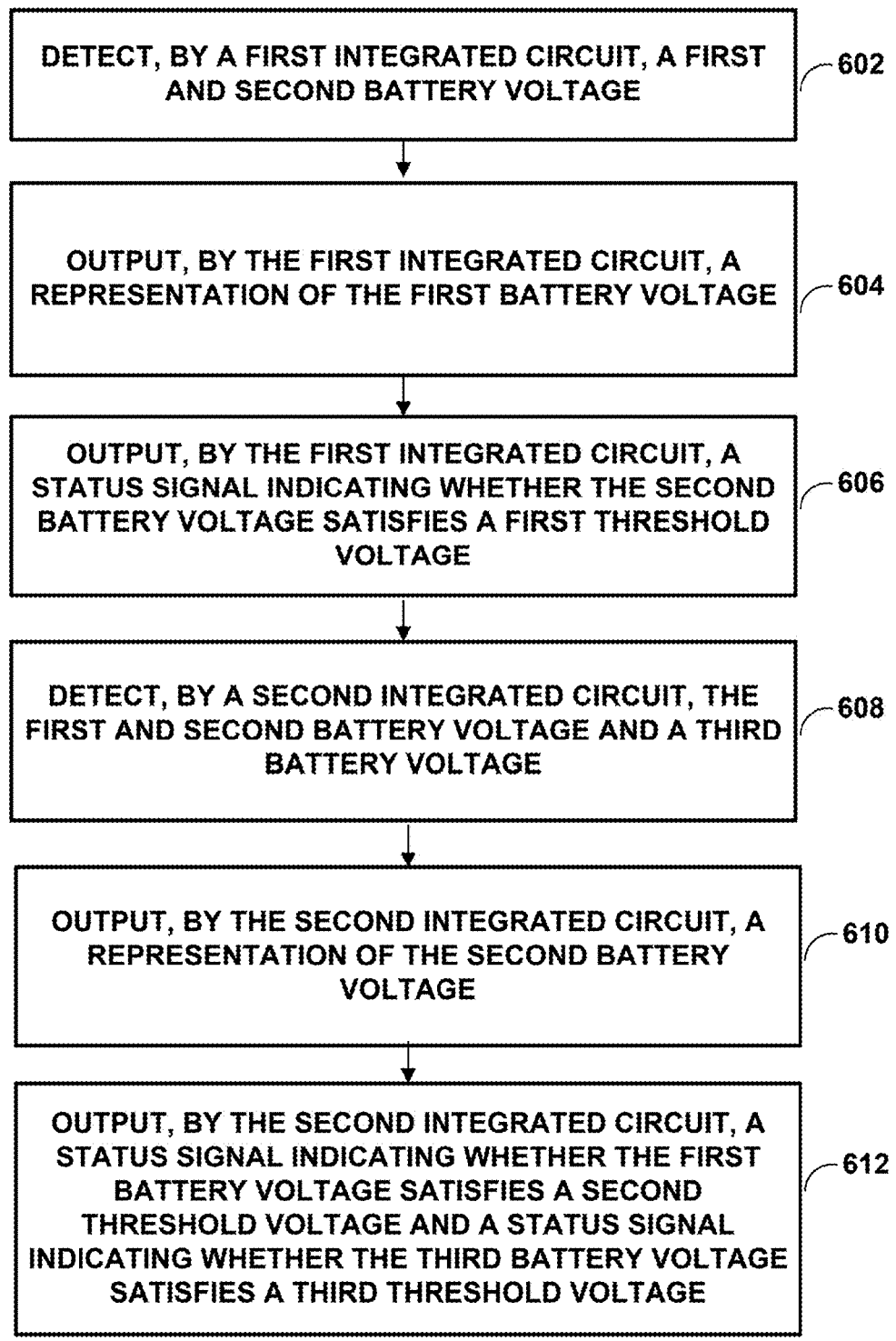
FIG. 6 is a flow diagram consistent with techniques that may be performed by a circuit in accordance with this disclosure.

FIG. 6 is a flow diagram consistent with techniques that may be performed by a circuit in accordance with this disclosure. For purposes of illustration only, the example operations are described below within the context of system 100 of FIG. 1, system 200 of FIG. 2, system 300 of FIG. 3, system 400 of FIG. 4, and system 500 of FIG. 5. However, the techniques described below can be used in any permutation, and in any combination, with battery pack 102, control module 108, and integrated circuits 110.

In accordance with one or more techniques of this disclosure, integrated circuit 110A, detects, a first battery voltage associated with battery cell 102A and detects, a second battery voltage associated with battery cell 102B (602). For example, integrated circuit 210A of FIG. 2, detects, a first battery voltage across positive terminal 220 and negative terminal 221 and detects, a second battery voltage across negative terminal 223 and positive terminal 224. Integrated circuit 110A, outputs, to control module 108, based on the detected first battery voltage, a representation of the first battery voltage (604). For example, integrated circuit 210A of FIG. 2, outputs a voltage that is proportional to the detected first battery voltage across positive terminal 220 and negative terminal 221.

Integrated circuit 110A, outputs, to control module 108, based on a comparison of the detected second battery voltage and a first threshold, a status signal indicating whether the second battery voltage satisfies the first threshold (606). For example, integrated circuit 210A of FIG. 2, outputs a first status logical signal (e.g., logical '1') indicating that the second battery voltage does not satisfy a predetermined safety voltage operating range when the detected second battery voltage is outside of the predetermined safety voltage operating range and outputs a second status logical signal (e.g., logical '0') indicating that the second battery voltage satisfies the predetermined safety voltage operating range when the detected second battery voltage is within the predetermined safety voltage operating range.

Integrated circuit 110B, detects, a first battery voltage associated with battery cell 102A, detects a second battery voltage associated with battery cell 102B, and detects a third battery voltage associated with battery cell 102N (608). For example, integrated circuit 210B of FIG. 2, detects, a first battery voltage across positive terminal 220 and negative terminal 221, detects a second battery voltage across negative terminal 223 and positive terminal 224, and detects a third battery voltage across positive terminal 225 and negative terminal 226. Integrated circuit 110B, outputs, to control module 108, based on the detected second battery voltage, a representation of the second battery voltage (610). For example, integrated circuit 210B of FIG. 2, outputs a voltage that is proportional to the detected second battery voltage across negative terminal 223 and positive terminal 224.

Integrated circuit 110B, outputs, to control module 108, based on a comparison of the detected first battery voltage and a second threshold, a status signal indicating whether the first battery voltage satisfies the second threshold and outputs, based on a comparison of the detected third battery voltage and a third threshold, a status signal indicating whether the third battery voltage satisfies the third threshold (612). For example, integrated circuit 210B of FIG. 2, outputs a first status logical signal (e.g., logical '1') indicating that the first battery voltage does not satisfy the predetermined safety voltage operating range when the detected first battery voltage is outside of the predetermined safety voltage operating range and outputs a second status logical signal (e.g., logical '0') indicating that the first battery voltage satisfies the predetermined safety voltage operating range when the detected first battery voltage is within the predetermined safety voltage operating range. Additionally, or alternatively, integrated circuit 210B of FIG. 2, outputs a first status logical signal (e.g., logical '1') indicating that the third battery voltage does not satisfy the predetermined safety voltage operating range when the detected third battery voltage is outside the predetermined safety voltage operating range and outputs a second status logical signal (e.g., logical '0') indicating that the third battery voltage satisfies the predetermined safety voltage operating range when the detected third battery voltage is within the predetermined safety voltage operating range.

The following examples may illustrate one or more aspects of the disclosure.

Example 1

A circuit comprising: a first integrated circuit configured to: detect a first battery voltage that is associated with a first battery cell; output, based on the detected first battery voltage, a representation of the first battery voltage; detect a second battery voltage that is associated with a second battery cell that is connected in series with the first battery cell; and output, based on a comparison of the detected second battery voltage and a first threshold, a status signal indicating whether the second battery voltage satisfies the first threshold; and a second integrated circuit configured to: detect the first battery voltage; output, based on a comparison of the detected first battery voltage and a second threshold, a status signal indicating whether the first battery voltage satisfies the second threshold; detect the second battery voltage; and output, based on the detected second battery voltage, a representation of the second battery voltage.

Example 2

The circuit of example 1, wherein the second integrated circuit is further configured to: detect a third battery voltage that is associated with a third battery cell that is connected in series with the first and second battery cells; and output, based on a comparison of the detected third battery voltage and a third threshold, a status signal indicating whether the third battery voltage satisfies the third threshold.

Example 3

The circuit of any combination of examples 1-2, further comprising a control module configured to: receive, from the first integrated circuit, a first set of status information, the first set of status information comprising the representation of the first battery voltage and the status signal indicating whether the second battery voltage satisfies the first threshold; receive, from the second integrated circuit, a second set of status information, the second set of status information comprising the representation of the second battery voltage, the status signal indicating whether the first battery voltage satisfies the second threshold, and the status signal indicating whether the third battery voltage satisfies the third threshold; and determine, based on the first and second sets of status information, whether the first, second, and third battery cells are operating in a safe state.

Example 4

The circuit of any combination of examples 1-3, wherein: the first battery voltage extends from a first voltage that is less than a local ground of the second integrated circuit to the local ground of the second integrated circuit; the second battery voltage extends from the local ground of the second integrated circuit to a second voltage that is greater than the local ground; and the third battery voltage extends from the second voltage to a third voltage that is greater than the second voltage.

Example 5

The circuit of any combination of examples 1-4, wherein: the first battery cell has a negative terminal coupled to a local ground of the first integrated circuit and a positive terminal coupled to the local ground of the second integrated circuit; the second battery cell has a negative terminal coupled to the positive terminal of the first battery cell and a positive terminal; and the third battery cell has negative terminal coupled to positive terminal of the second battery cell and a positive terminal.

Example 6

The circuit of any combination of examples 1-5, wherein the first, second, and third battery voltages are substantially equal.

Example 7

The circuit of any combination of examples 1-6, further comprising: a third integrated circuit configured to: detect the second battery voltage; output, based on a comparison of the detected second battery voltage and a fourth threshold, a status signal indicating whether the second battery voltage satisfies the fourth threshold; detect the third battery voltage; and output, based on the detected third battery voltage, a representation of the third battery voltage.

Example 8

The circuit of any combination of examples 1-7, wherein the first, second, third, and fourth thresholds are equal.

Example 9

The circuit of any combination of examples 1-8, wherein the first integrated circuit detects the first battery voltage with less error than the second battery voltage.

Example 10

A method comprising: detecting, by a first integrated circuit, a first battery voltage associated with a first battery cell; outputting, by the first integrated circuit, based on the detected first battery voltage, a representation of the first battery voltage; detecting, by the first integrated circuit, a second battery voltage associated with a second battery cell that is connected in series with the first battery cell; outputting, by the first integrated circuit, based on a comparison of the detected second battery voltage and a first threshold, a status signal indicating whether the second battery voltage satisfies the first threshold; detecting, by a second integrated circuit, the first battery voltage; outputting, by the second integrated circuit, based on a comparison of the detected first battery voltage and a second threshold, a status signal indicating whether the first battery voltage satisfies the second threshold; detecting, by the second integrated circuit, the second battery voltage; and outputting, by the second integrated circuit, based on the detected second battery voltage, a representation of the second battery voltage.

Example 11

The method of example 10, further comprising: detecting, by the second integrated circuit, a third battery voltage associated with a third battery cell that is connected in series with the first and second battery cell; and outputting, by the second integrated circuit, based on a comparison of the detected third battery voltage and a third threshold, a status signal indicating whether the third battery voltage satisfies the third threshold.

Example 12

The method of any combination of examples 10-11, wherein the first, second, and third thresholds are equal.

Example 13

The method of any combination of examples 10-12, wherein the first battery voltage extends from a local ground of the first integrated circuit to a local ground of the second integrated circuit.

Example 14

The method of any combination of examples 10-13, wherein: the first battery cell includes a negative terminal coupled to the local ground of the first integrated circuit and a positive terminal coupled to the local ground of the second integrated circuit; the second battery cell includes a negative terminal coupled to the positive terminal of the first battery cell and a positive terminal; and the third battery cell includes a negative terminal coupled to the positive terminal of the second battery cell and a positive terminal.

Example 15

A system comprising: a plurality of battery cells electronically coupled to each other in series to form a battery pack, the plurality of battery cells comprising a first battery cell and a second battery cell; a first integrated circuit configured to: detect a first battery voltage of the first battery cell; output, based on the detected first battery voltage, a representation of the first battery voltage; and detect a second battery voltage of the second battery cell; and a second integrated circuit configured to: detect the second battery voltage of the second battery cell; output, based on the detected second battery voltage, a representation of the second battery voltage; and detect the first battery voltage of the first battery cell.

Example 16

The system of example 15, wherein: the first integrated circuit is further configured to output, based on a comparison of the second battery voltage and a first threshold, a status signal indicating whether the second battery voltage satisfies the first threshold; and the second integrated circuit is further configured to output, based on a comparison of the first battery voltage and a second threshold, a status signal indicating whether the second battery voltage satisfies the second threshold.

Example 17

The system of any combination of examples 15-16, wherein: the first battery cell has a negative terminal coupled to a local ground of the first integrated circuit and a positive terminal coupled to a local ground of the second integrated circuit; and the second battery cell has a negative terminal coupled to the positive terminal of the first battery cell and a positive terminal.

Example 18

The system of any combination of examples 15-17, wherein: the plurality of battery cells further comprises a third battery cell, the third battery cell having a negative terminal coupled to the positive terminal of the second battery cell and a positive terminal; and the second integrated circuit is further configured to detect a third battery voltage of the third battery cell.

Example 19

The system of any combination of examples 15-18, wherein the second integrated circuit is further configured to output, based on a comparison of the third battery voltage and a third threshold, a status signal indicating whether the third battery voltage satisfies the third threshold.

Example 20

The system of any combination of examples 15-19, further comprising a control module configured to: receive, from the first integrated circuit, a first set of status information, the first set of status information comprising the representation of the first battery voltage and the status signal indicating whether the second battery voltage satisfies the first threshold; receive, from the second integrated circuit, a second set of status information, the second set of status information comprising the representation of the second battery voltage, the status signal indicating whether the first battery voltage satisfies the second threshold, and the status signal indicating whether the third battery voltage satisfies the third threshold; and determine, based on the first and second sets of status information, whether the battery pack is operating in a safe state.

Various aspects have been described in this disclosure. Although many aspects of this disclosure have been described in in the context of a single cell lithium ion battery voltage monitoring system, the system and techniques are not limited to single cell scenarios or lithium ion system battery system. The same or similar techniques may be used in systems having any number of cells and batteries that use other types of battery chemistry. These and other aspects are within the scope of the following claims.

The invention claimed is:

1. A circuit comprising:
a first integrated circuit configured to:
  detect a first battery voltage that is associated with a first battery cell;
  output, based on the detected first battery voltage, a representation of the first battery voltage;
  detect a second battery voltage that is associated with a second battery cell that is connected in series with the first battery cell; and
  output, based on a comparison of the detected second battery voltage and a first threshold, a status signal indicating whether the second battery voltage satisfies the first threshold; and
a second integrated circuit configured to:
  detect the first battery voltage;
  output, based on a comparison of the detected first battery voltage and a second threshold, a status signal indicating whether the first battery voltage satisfies the second threshold;
  detect the second battery voltage; and
  output, based on the detected second battery voltage, a representation of the second battery voltage.

2. The circuit according to claim 1, wherein the second integrated circuit is further configured to:
detect a third battery voltage that is associated with a third battery cell that is connected in series with the first and second battery cells; and
output, based on a comparison of the detected third battery voltage and a third threshold, a status signal indicating whether the third battery voltage satisfies the third threshold.

3. The circuit according to claim 2, further comprising a control module configured to:
receive, from the first integrated circuit, a first set of status information, the first set of status information comprising the representation of the first battery voltage and the status signal indicating whether the second battery voltage satisfies the first threshold;
receive, from the second integrated circuit, a second set of status information, the second set of status information comprising the representation of the second battery voltage, the status signal indicating whether the first battery voltage satisfies the second threshold, and the status signal indicating whether the third battery voltage satisfies the third threshold; and
determine, based on the first and second sets of status information, whether the first, second, and third battery cells are operating in a safe state.

4. The circuit according to claim 3, wherein:
the first battery voltage extends from a first voltage that is less than a local ground of the second integrated circuit to the local ground of the second integrated circuit;
the second battery voltage extends from the local ground of the second integrated circuit to a second voltage that is greater than the local ground; and
the third battery voltage extends from the second voltage to a third voltage that is greater than the second voltage.

5. The circuit according to claim 4, wherein:
the first battery cell has a negative terminal coupled to a local ground of the first integrated circuit and a positive terminal coupled to the local ground of the second integrated circuit;
the second battery cell has a negative terminal coupled to the positive terminal of the first battery cell and a positive terminal; and
the third battery cell has negative terminal coupled to positive terminal of the second battery cell and a positive terminal.

6. The circuit according to claim 5, wherein the first, second, and third battery voltages are substantially equal.

7. The circuit according to claim 2, further comprising:
a third integrated circuit configured to:
  detect the second battery voltage;
  output, based on a comparison of the detected second battery voltage and a fourth threshold, a status signal indicating whether the second battery voltage satisfies the fourth threshold;
  detect the third battery voltage; and
  output, based on the detected third battery voltage, a representation of the third battery voltage.

8. The circuit according to claim 7, wherein the first, second, third, and fourth thresholds are equal.

9. The circuit according to claim 1, wherein the first integrated circuit detects the first battery voltage with less error than the second battery voltage.

10. A method comprising:
detecting, by a first integrated circuit, a first battery voltage associated with a first battery cell;
outputting, by the first integrated circuit, based on the detected first battery voltage, a representation of the first battery voltage;
detecting, by the first integrated circuit, a second battery voltage associated with a second battery cell that is connected in series with the first battery cell;
outputting, by the first integrated circuit, based on a comparison of the detected second battery voltage and a first threshold, a status signal indicating whether the second battery voltage satisfies the first threshold;

detecting, by a second integrated circuit, the first battery voltage;

outputting, by the second integrated circuit, based on a comparison of the detected first battery voltage and a second threshold, a status signal indicating whether the first battery voltage satisfies the second threshold;

detecting, by the second integrated circuit, the second battery voltage; and outputting, by the second integrated circuit, based on the detected second battery voltage, a representation of the second battery voltage.

11. The method according to claim 10, further comprising:

detecting, by the second integrated circuit, a third battery voltage associated with a third battery cell that is connected in series with the first and second battery cell; and outputting, by the second integrated circuit, based on a comparison of the detected third battery voltage and a third threshold, a status signal indicating whether the third battery voltage satisfies the third threshold.

12. The method according to claim 11, wherein the first, second, and third thresholds are equal.

13. The method according to claim 12, wherein the first battery voltage extends from a local ground of the first integrated circuit to a local ground of the second integrated circuit.

14. The method according to claim 13, wherein:

the first battery cell includes a negative terminal coupled to the local ground of the first integrated circuit and a positive terminal coupled to the local ground of the second integrated circuit;

the second battery cell includes a negative terminal coupled to the positive terminal of the first battery cell and a positive terminal; and the third battery cell includes a negative terminal coupled to the positive terminal of the second battery cell and a positive terminal.

15. A system comprising:

a plurality of battery cells electrically coupled to each other in series to form a battery pack, the plurality of battery cells comprising a first battery cell and a second battery cell;

a first integrated circuit configured to:

detect a first battery voltage of the first battery cell;

output, based on the detected first battery voltage, a representation of the first battery voltage;

detect a second battery voltage of the second battery cell; and output, based on a comparison of the second battery voltage and a first threshold, a status signal indicating whether the second battery voltage satisfies the first threshold; and a second integrated circuit configured to:

detect the second battery voltage of the second battery cell;

output, based on the detected second battery voltage, a representation of the second battery voltage;

detect the first battery voltage of the first battery cell; and output, based on a comparison of the first battery voltage and a second threshold, a status signal indicating whether the second battery voltage satisfies the second threshold.

16. The system according to claim 15, wherein:

the first battery cell has a negative terminal coupled to a local ground of the first integrated circuit and a positive terminal coupled to a local ground of the second integrated circuit; and the second battery cell has a negative terminal coupled to the positive terminal of the first battery cell and a positive terminal.

17. The system according to claim 16, wherein:

the plurality of battery cells further comprises a third battery cell, the third battery cell having a negative terminal coupled to the positive terminal of the second battery cell and a positive terminal; and the second integrated circuit is further configured to detect a third battery voltage of the third battery cell.

18. The system according to claim 17, wherein the second integrated circuit is further configured to output, based on a comparison of the third battery voltage and a third threshold, a status signal indicating whether the third battery voltage satisfies the third threshold.

19. The system according to claim 18, further comprising a control module configured to:

receive, from the first integrated circuit, a first set of status information, the first set of status information comprising the representation of the first battery voltage and the status signal indicating whether the second battery voltage satisfies the first threshold;

receive, from the second integrated circuit, a second set of status information, the second set of status information comprising the representation of the second battery voltage, the status signal indicating whether the first battery voltage satisfies the second threshold, and the status signal indicating whether the third battery voltage satisfies the third threshold; and determine, based on the first and second sets of status information, whether the battery pack is operating in a safe state.

* * * * *